United States Patent [19]

Bayraktaroglu

[11] Patent Number: 4,706,041

[45] Date of Patent: Nov. 10, 1987

[54] PERIODIC NEGATIVE RESISTANCE MICROWAVE STRUCTURES AND AMPLIFIER AND OSCILLATOR EMBODIMENTS THEREOF

[75] Inventor: Burhan Bayraktaroglu, Plano, Tex.

[73] Assignee: Texas Instruments Incorporated, Dallas, Tex.

[21] Appl. No.: 868,212

[22] Filed: May 28, 1986

Related U.S. Application Data

[63] Continuation-in-part of Ser. No. 842,526, Mar. 21, 1986.

[51] Int. Cl.[4] .......................... H01P 3/08; H01P 7/08; H03B 7/14; H03F 3/60
[52] U.S. Cl. ...................................... 331/52; 330/287; 330/54; 331/99; 331/107 SL; 333/247; 357/45; 357/51; 357/57
[58] Field of Search ..................... 331/52, 56, 96, 99, 331/107 DP, 107 P, 107 SL, 117 D, 177 V; 330/286, 287, 53, 54; 333/219, 220, 238, 247, 250, 236; 357/13, 14, 16, 40, 45, 51, 57, 49

[56] References Cited

U.S. PATENT DOCUMENTS 3,491,310  1/1970  Hines ..................................... 331/96
3,702,971  11/1972  Kawamoto et al. ..... 331/107 SL X Primary Examiner—Siegfried H. Grimm
Attorney, Agent, or Firm—Carlton H. Hoel; Leo N. Heiting; Melvin Sharp

[57] ABSTRACT

Structures (30) with IMPATT type diodes (34) located periodically along a transmission line (38-32) to simulate a distributed diode are disclosed. Preferred embodiments include incorporation of the periodic diode structures as the gain element of microwave amplifiers and oscillators. Preferred embodiments also place capacitors between the diodes to fix nodes in the electric field and increase the effective structure size.

23 Claims, 28 Drawing Figures

PERIODIC NEGATIVE RESISTANCE MICROWAVE STRUCTURES AND AMPLIFIER AND OSCILLATOR EMBODIMENTS THEREOF

CROSS-REFERENCE TO RELATED APPLICATION

This application is a continuation-in-part of copending application Ser. No. 842,526, filed Mar. 21, 1986. The cross-referenced application is assigned to the assignee of this application.

BACKGROUND OF THE INVENTION

1. Field of the Invention

The present invention relates to semiconductor devices and fabrication methods, and, more particularly, to periodically distributed microwave semiconductor device structures.

2. Description of the Related Art.

Semiconductor devices such as transistors are limited by transit time and other effects to frequencies below a few GHz; and thus d-c to microwave power conversion and amplification at microwave frequencies are typically performed by semiconductor devices such as IMPATT diodes and Gunn diodes or tube devices such as magnetrons and gyrotrons. In particular, IMPATT diodes for millimeter wave (30–300 GHz) power generation have played an important role in the advance of millimeter wave systems in fields such as communications, radar, medical research, etc. See, generally, H. Kuno, IMPATT Devices for Generation of Millimeter Waves, in K. Button, Ed., Infrared and Millimeter Waves (Academic Press, 1979), which is hereby incorporated by reference as are all other references cited herein.

However, IMPATT diode junction temperatures should be kept as low as possible for reliable operation; in particular, estimates on silicon IMPATTs indicate an upper limit of 250° C. for safe multiple-year operation. But the small signal admittance (which has negative real part) of an IMPATT generally increases in magnitude as the d-c bias current increases up to current densities in the order of $10^3$ to $10^5$ A/cm$^2$. Thus to achieve maximum output power plus reliable operation, the heat dissipated in the diode must be efficiently removed.

Heat removal for an IMPATT is typically accomplished by plating a metal heat sink to the p+ side of the diode or thermal-compression bonding the p+ side to a heat sink. But the thermal resistance is inversely proportional to device area, so for higher frequencies (where the area must be minimized to reduce the junction capacitance) the removal of the heat dissipated in the junction limits the power output. Indeed, below about 100 GHz the limitation on IMPATT power appears to be determined by thermal limitations; see Kuno, pp. 95–97.

Further, IMPATT diodes are typically discrete devices mounted in circuits such as reduced height, top-hat resonator, and coaxial waveguides; but such mechanical mounting leads to assembly errors, lack of ruggedness, and impedance mismatches. As the junction thickness is decreased for higher frequency operation, the diode area is decreased to maintain impedance levels: and since the small signal impedance depends upon the reciprocal of the junction capacitance, higher frequency devices are made to have smaller areas. Furthermore, it is more difficult to adjust the parameters of such circuits at high frequencies to produce low impedance levels. See, S. Sze, Physics of Semiconductor Devices p. 607 (Wiley, 2d Ed., 1981) for the frequency scaling of IMPATT parameters. Also, Kuno, p. 97, points out that above about 100 GHz, the limitation on power appears to be determined by adverse effects of diode package and mounting parasitics.

Attempts to overcome such mismatch and mounting parasitics problems with discrete IMPATT diodes include the distributed IMPATT diode in which an extended IMPATT has its p+ and n+ layers acting as the plates of a parallel plate transmission line and the depletion layer as the dielectric. See, M. Franz and J. Beyer. The Travelling-Wave IMPATT Mode, 26 IEEE Trans. Microwave Theory and Techniques, 861 (1978) and M. Franz and J. Beyer, The Travelling-Wave IMPATT Mode: Part II—The Effective Wave Impedance and Equivalence Transmission Line, 28 IEEE Trans. Microwave Theory and Techniques, 215–218 (1980). The original distributed diode work appears to be M. Hines, High-Frequency Negative-Resistance Circuit Principles for Esaki Diode Applications, The Bell System Technical Journal 477 (May 1960). However, the large spatial extent of a distributed IMPATT makes the heat dissipated more difficult to remove than that of a small diode for the same current density because of the lack of thermal spreading in the heat sink. Further, the depletion layer of a distributed IMPATT gives an attenuation constant much larger than that of a corresponding typical transmission line because the conductance of the semiconductor is high compared to that of usual transmission line dielectric. Note that the attenuation constant may be approximated at high frequencies as the sum of two terms: one term associated with conductor losses and the other term associated with dielectric losses; and this latter term is of the form $\frac{1}{2} g Z_0$ with g the dielectric conductance per length. See, generally, G. Vendelin, Design of Amplifiers and Oscillators by the S-Parameter Method, p. 65 (Wiley 1982). Indeed, the distributed IMPATT limits device design flexibility because the properties of the diode and the transmission line cannot be separately optimized: for example, the loading of a transmission line is not necessarily uniform for optimum efficiency.

Thus it is a problem to achieve high power efficiency, ease of matching to external circuits, and compact size for microwave diodes.

SUMMARY OF THE INVENTION

The present invention provides monolithic structures incorporating multiple discrete microwave negative resistance devices into a transmission line which absorbs the device impedance into the characteristic impedance of the transmission line; the devices are periodically placed on a heat sink which acts as the ground plane. Preferred embodiments include use of IMPATT diodes and segments of such a periodic diode-loaded transmission line structure as a two-port amplifier and as a self-resonating oscillator with voltage controlled frequency tuning. The diodes are thermally separated from each other for efficient heat removal but still simulate a distributed diode to provide built-in resonator capability; and the structures may be fabricated monolithically to provide consistent impedance matching and microstrip connectability.

This solves the heat sinking, attenuation, impedance matching and efficiency problems of the known discrete and distributed microwave diodes.

BRIEF DESCRIPTION OF THE DRAWINGS

The drawings are schematic for clarity.

DESCRIPTION OF THE PREFERRED EMBODIMENTS

Figure 1A:
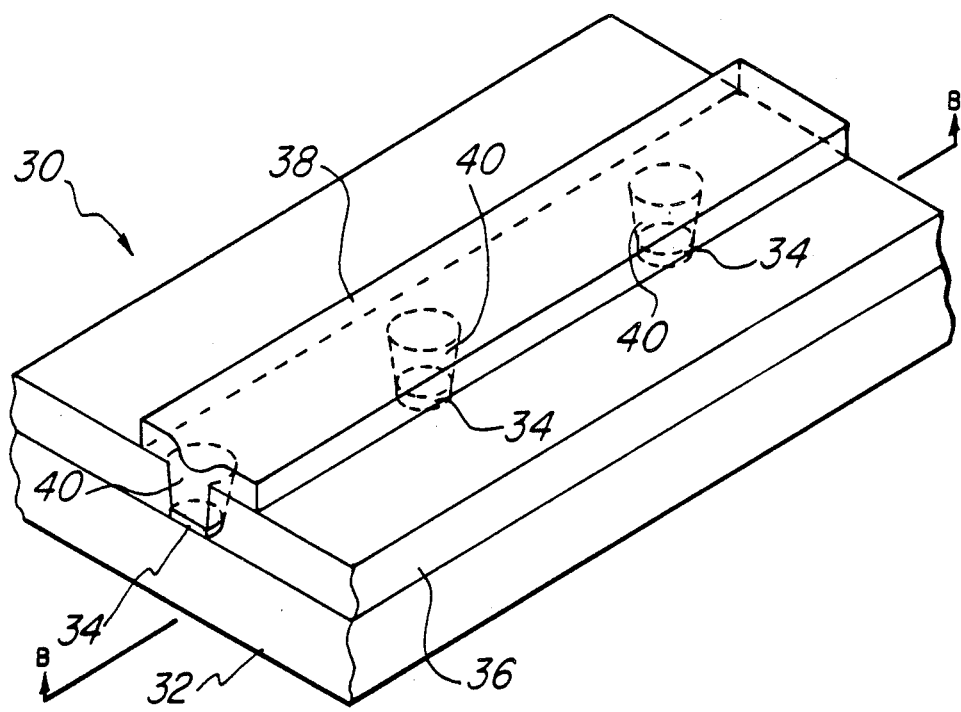
FIGS. 1A–D are cutaway perspective, cross sectional elevation and equivalent circuit views of a first preferred embodiment periodic microwave diode structure, plus a small signal admittance graph of the diodes.
Figure 1B:
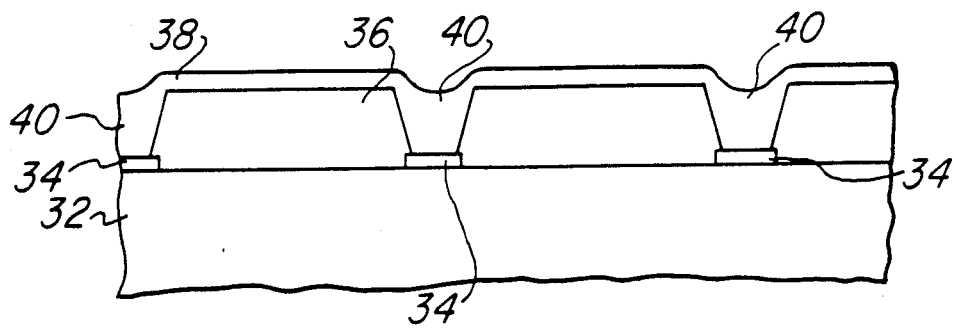

FIG. 1A is a schematic cutaway perspective view of a portion of a first preferred embodiment periodic IMPATT diode structure, generally denoted 30, which includes heat sink 32, periodically placed IMPATT diodes 34 (the diode in the left hand portion of FIG. 1A is partially cutaway), polyimide layer 36, and titanium/tungsten and gold microstrip 38 which has extensions down vias 40 to contact diodes 34. FIG. 1B is a cross sectional elevation view along line B—B of FIG. 1A.

The dimensions of the elements of structure 30 will vary with the frequencies of interest, as will the element parameters, and typically are as follows: heat sink 32 is 0.2 mm thick, diodes 34 are each 1.2 $\mu$m thick and circular with diameter 50 $\mu$m, polyimide 36 is 10–20 $\mu$m thick, conductor microstrip 38 is 2–5 $\mu$m thick and 200–1,000 $\mu$m wide, and diodes 34 are spaced about 500 $\mu$m apart, center-to-center. Thus structure 30 is in the form of microstrip transmission line 42 (microstrip 38 over dielectric polyimide 36 on metal substrate 32) loaded by diodes 34. The d-c bias currents for diodes 34 are supplied through microstrip 38, vias 40, and heat sink 32; high impedance connections for the d-c bias currents to microstrip 38 are not shown in the Figures. Typical bias voltages would be 10 to 20 volts, and typical bias currents would be about 300 mA for each of diodes 34 (diode current density of $10^3$–$10^5$ A/cm$^2$); under these operating conditions diodes 34 can each yield up to 1 watt of a-c power (30% efficiency).

Figure 1C:
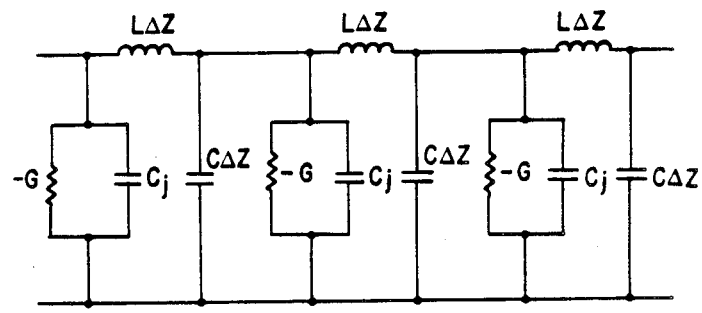
Figure 1D:
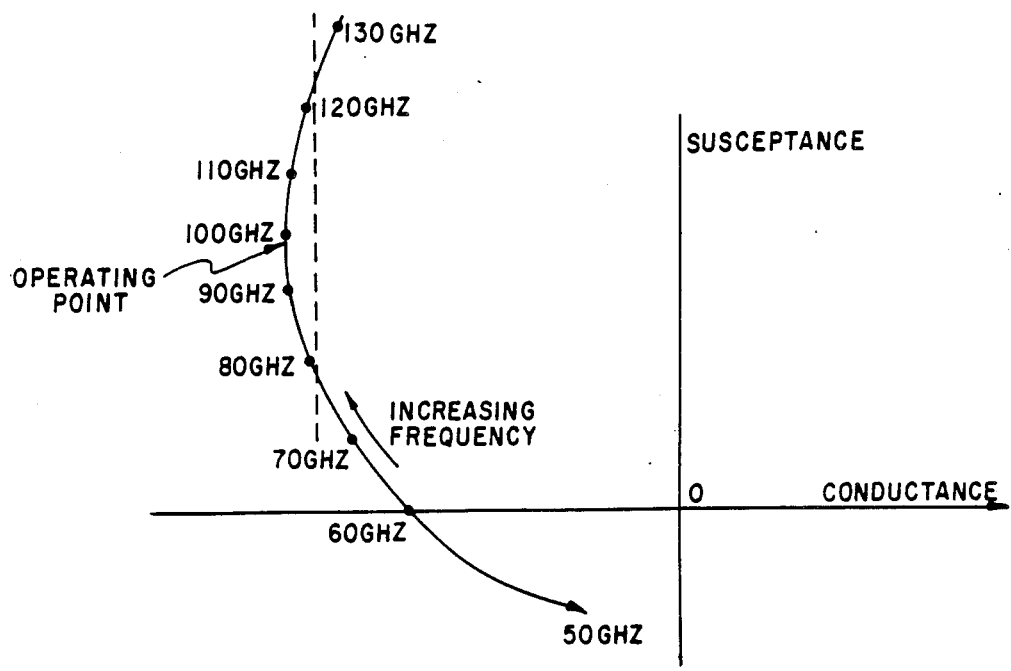

The small signal equivalent circuit for structure 30 is shown in FIG. 1C. L$\Delta$z and C$\Delta$z are the inductance and capacitance for a length $\Delta$z of microstrip transmission line 42 (which can be approximated as lossless), and $-G$ and $C_j$ model the IMPATT diode as a negative conductance plus junction capacitance. Note that the small signal admittance for each of diodes 34 varies with frequency and is typically as shown in FIG. 1D; thus the model is an approximation by the broken line. IMPATT diodes are typically operated near the point of greatest magnitude negative conductance for efficiency reasons. Diodes 34 are all identical and equispaced along microstrip 38, so $C_j$ and $-G$ can be approximated as distributed along transmission line 42 and thus absorbed into the transmission line impedance to yield in effect a transmission line with gain as indicated by FIG. 1C. To insure the validity of such approximation, the spacing of diodes 34 should be kept less than one half of the wavelength of the signals of interest. At 100 GHz typical values for L, C, $C_j$, and $-G$ would be 5 nH/mm, 2 pF/mm, 0.4 pF, and 20 mS, respectively.

Structure 30 can provide gain and be used as the active portion of devices such as amplifiers or oscillators. The separation of diodes 34 provides thermal spreading in heat sink 32 and efficient removal of the heat dissipated in diodes 34, so the bias current may be selected for efficient power generation. The approximately distributed nature of diodes 34 implies that structure 30 has the advantages of distributed IMPATTs; and the polyimide 36 dielectric implies that the attenuation of distributed IMPATTs is avoided. Illustrative examples of other preferred embodiment periodic IMPATT structures incorporated into amplifiers and oscillators will be given after a discussion of a method of fabricating structure 30.

FIGS. 2A–F illustrate in cross sectional elevation views the steps of a method of fabricating structure 30 and similar structures. This method is the subject matter of applicant's copending application Ser. No. 697,301, filed Jan. 31, 1985. The type of IMPATT diode illustrated is a double drift, and the fabrication proceeds as follows.

Figure 2A:
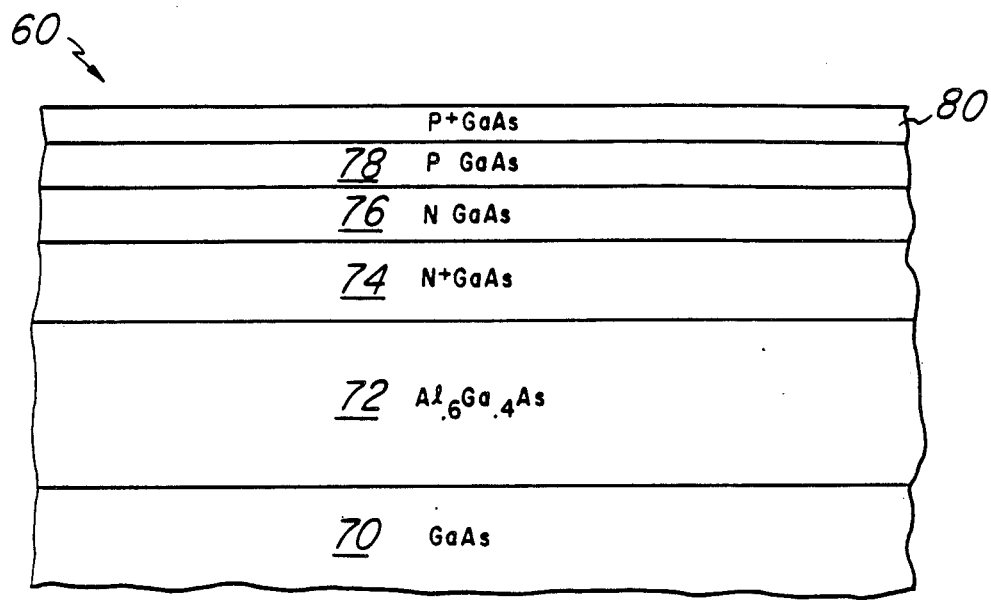
FIGS. 2A–F are cross sectional elevation views illustrating steps in a method of fabrication of the first preferred embodiment.
Figure 2B:
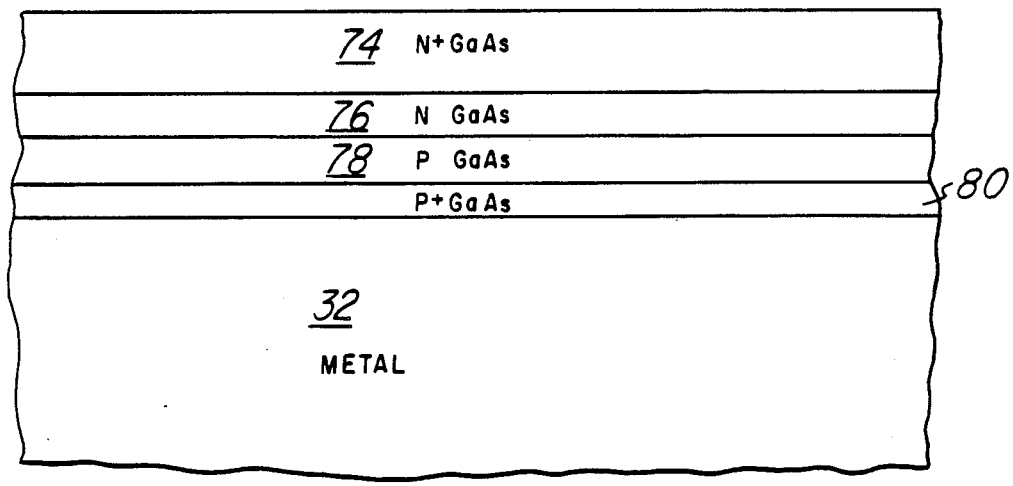
Figure 2C:
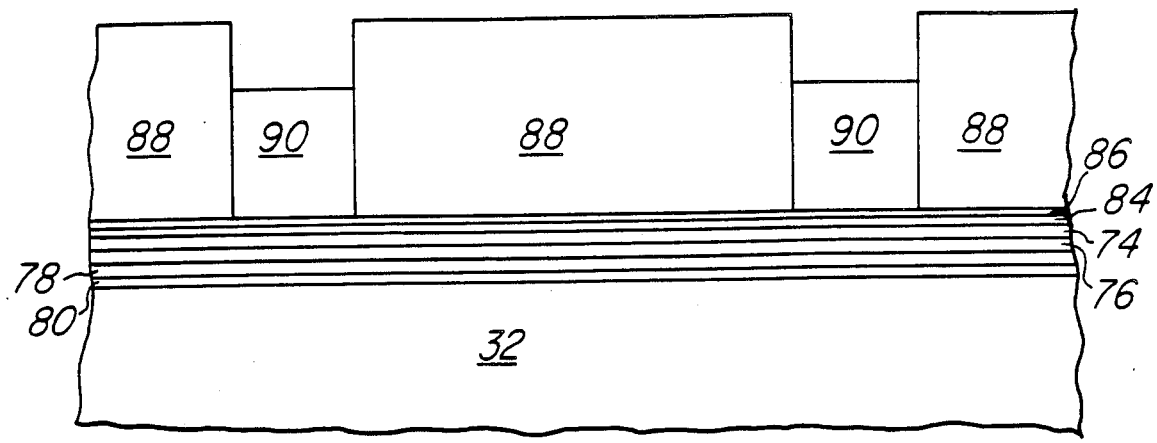
Figure 2D:
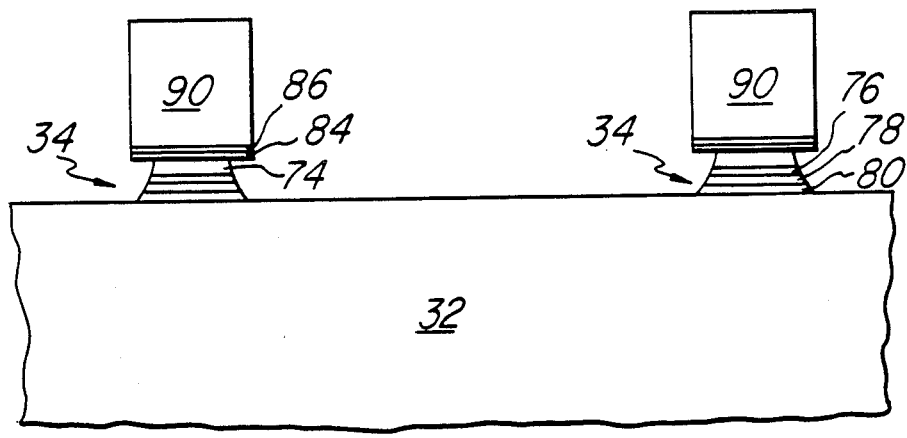
Figure 2E:
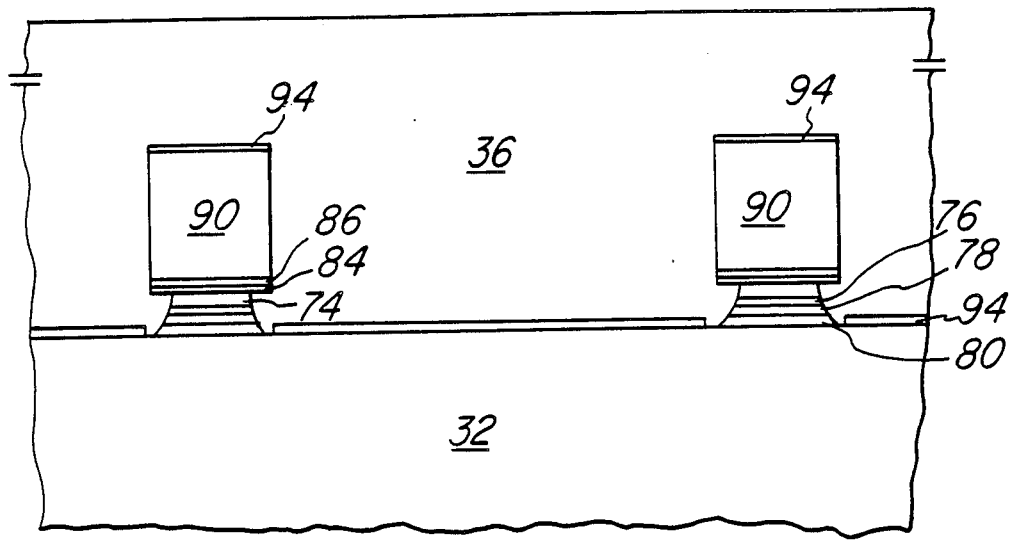
Figure 2F:
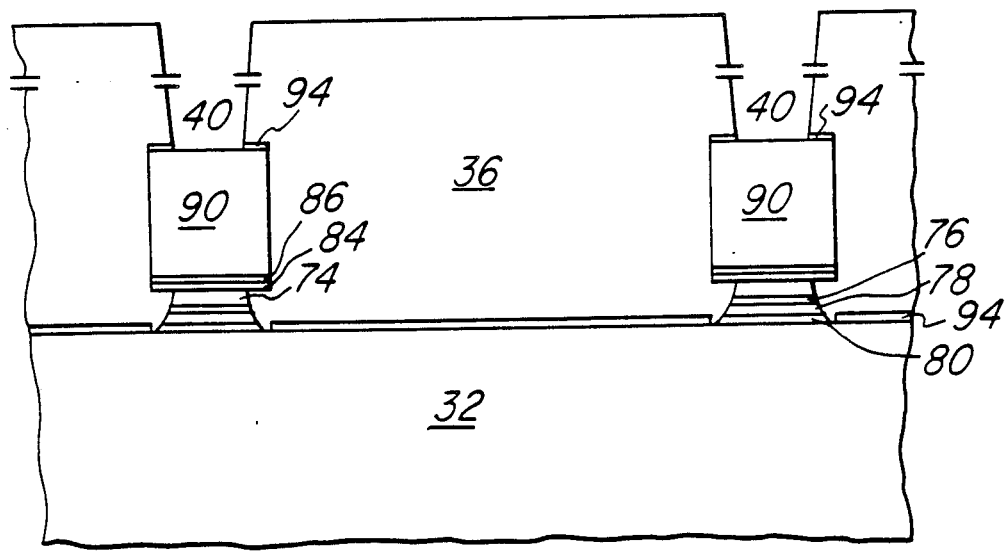

(a) Single crystal semiconductor multilayer structure 60 is grown by molecular beam epitaxy (MBE), metal organic chemical vapor deposition (MOCVD), or similar techniques beginning with gallium arsenide (GaAs) substrate 70 and adding successive layers with composition, thickness, and doping level as set forth in the following table; see FIG. 2A for a cross sectional view.

| Layer | Composition | Thickness | Doping (cm$^{-3}$) |
|---|---|---|---|
| 70 | GaAs | large | undoped |
| 72 | Al$_{0.6}$Ga$_{0.4}$As | 1.0 $\mu$m | undoped |
| 74 | n$^+$GaAs | 0.5 $\mu$m | 1 $\times$ 10$^{19}$ |
| 76 | n GaAs | 0.3 $\mu$m | 2 $\times$ 10$^{17}$ |
| 78 | p GaAs | 0.3 $\mu$m | 2 $\times$ 10$^{17}$ |
| 80 | p$^+$GaAs | 0.2 $\mu$m | 1 $\times$ 10$^{19}$ |

Note that MBE and MOCVD with in situ doping provides very sharp junctions between the drift layers 78 and 80; this avoids the fall off of negative conductance at high frequencies associated with a doping transition region at the junction.

(b) Heat sink 32 is formed by sputter depositing 0.1 $\mu$m of titanium/tungsten alloy on layer 80, followed by sputtering 0.4 μm of gold onto the first metallization, and lastly by plating 150 μm of gold, silver, or copper onto the sputter deposited gold. The thickness of heat sink 32 is not significant but should be large enough to provide mechanical support and heat transport. Note that heat sink 32 will be mounted on heat sinking packaging, so the surface of heat sink 32 should be smooth for good contact.

(c) With heat sink 32 now available to act as the supporting substrate, GaAs substrate 70 is removed, such as by mechanical abrading to remove the bulk of layer 70 followed by a selective wet etching of the remainder of layer 70 with an etchant that will stop at the $Al_{0.6}Ga_{0.4}As$ of layer 72. An etchant such as a solution of hydrogen peroxide with five percent ammonium hydroxide can provide the selectivity. Next layer 72 is removed by selective wet etching with an etch such as hydrofluoric or hydrochloric acid; this removes the $Al_{0.6}Ga_{0.4}As$ and stops at the GaAs of layer 74. See FIG. 2B in which the vertical orientation of multilayer structure 60 has been reversed from FIG. 2A.

(d) A 0.1 μm thick layer 84 of titanium/tungsten followed by a 0.1 μm thick layer 86 of gold are sputtered onto layer layer 74; the gold is primarily to prevent oxidization of the titanium/tungsten alloy, and the titanium/tugsten is chosen for its good adherence to and low alloy reaction with GaAs. Photoresist 88 is spun onto layer 86 to a thickness of about 3 μm and photolithographically patterned to open up a series of circular areas with diameters 50 μm that will essentially define diodes 34. Gold 90 is plated to a thickness of 2.0 μm on the portion of layer 86 exposed by these circular photoresist opening; see FIG. 2C in which the vertical scale is exaggerated for clarity.

(e) Photoresist 88 is ashed and the now-exposed portions of titanium/tungsten and gold layers 84 and 86 are removed with a wet etch; this etch also removes a small portion of gold 90 so extensive overetch is avoided. Next, an isotropic GaAs etch is used to form diodes 34 as measas with gold 90 acting as the etch mask; the isotropic aspect of the etch leads to an overhang by gold 90. See FIG. 2D. The GaAs etch may be either a wet or plasma etch, and overetching is limited to control the diameter of diodes 34.

(f) Titanium or chromium layer 94 is deposited by evaporation to a thickness of 0.02 μm onto the exposed portion of heat sink 32 and onto gold 90; note that the overhang of gold 90 prevents deposition of titanium along the sides of diodes 34 and thereby avoids shorting out the p-n junction. Then polyimide is spun on and cured to form polyimide layer 36 to a thickness of 10 μm; note that the polyimide may be applied in stage with a few μm spun on in each stage. Titanium or chromium layer 94 is to provide a clean surface for polyimide 36 adherence; note that titanium and chromium adhere to the surface of heat sink 32 quite well despite the exposure of the surface to the GaAs etchant. See FIG. 2E.

(g) A germanium layer is deposited on polyimide 36 to a thickness of 0.05 μm; photoresist is spun onto the germanium and photolithographically patterned to form openings directly above gold 90. The patterned resist is used as a mask for etching the germanium with a $CF_4/O_2$ plasma. Then the resist is ashed and the etched germanium is used as a mask for $O_2$ RIE etching of polyimide 36 to form vias 40 down to titanium 94 on gold 90. The germanium is then stripped; this stripping may also remove the exposed titanium or chromium 94 on gold 90. See FIG. 2F.

(h) Titanium is evaporated to a thickness of 0.02 μm followed by gold to a thickness of 0.1 μm onto polyimide 36 and exposed gold 90; this titanium will provide good adherence to polyimide 36. Next, additional gold is sputtered to fully metallize the side walls of vias 40 and to a thickness of 0.2 μm on polyimide 36. A thick (2-5 μm) layer of gold is electroplated over the sputtered gold. The gold and titanium are patterned and etched to form microstrip 38 and complete structure 30; see FIGS. 1A-B in which the vertical scale exaggeration has been eliminated and consequently details of the thin layers have been suppressed for clarity.

Figure 3A:
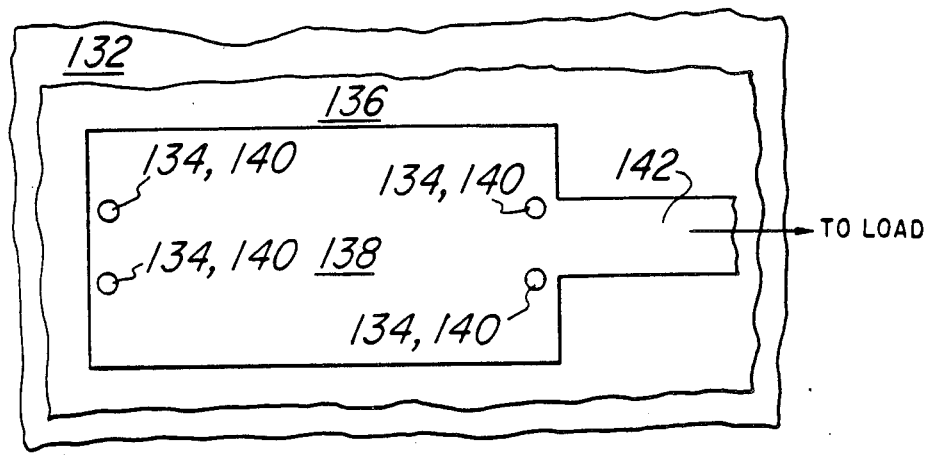
FIGS. 3A–B are plan and cross sectional elevation views of a second preferred embodiment periodic microwave diode structure.
Figure 3B:
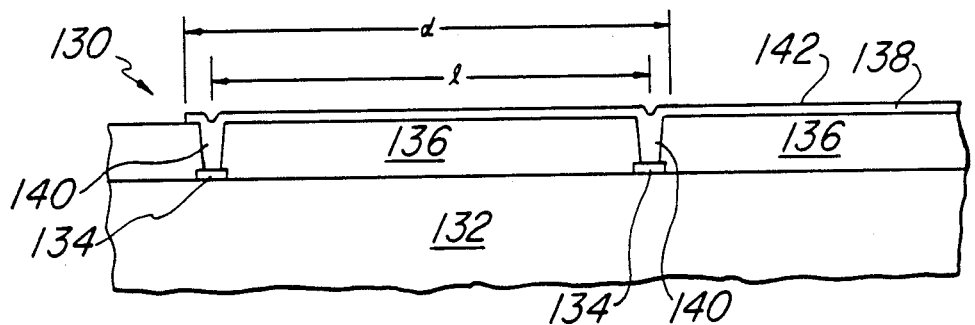

Second preferred embodiment periodic IMPATT diode structure, generally denoted 130 and illustrated in plan and cross sectional elevation views in FIGS. 3A-B, is connected by a microstrip transmission line to a load and forms an oscillator. Oscillator 130 includes heat sink 132, polyimide layer 136 four IMPATT diodes 134 located as two pairs, microstrip segment 138 with a via 140 extending down to each diode, and microstrip segment transmission line 142; microstrip 142 transmits the output of the diode-loaded transmission line segment defined by microstrip 138 to a load, with impedance transformations depending upon the load impedance. The pairs of diodes 134 are periodically placed along microstrip 138 for one period, and the diodes are each 35 μm in diameter with the diodes of each pair separated by 100 μm to provide thermal spreading in heat sink 132. Microstrip 138 has thickness 5 μm, width 300 μm, and length d mm; polyimide 136 has thickness 15 μm; microstrip 142 has width 100 μm and the same thickness as microstrip 138 (so microstrip transmission line 142 has a characteristic impedance of about 15 Ω and can be part of a quarter wave impedance match from oscillator 130 to a 50 Ω microstrip transmission line); diodes 134 each have a small signal junction capacitance of $C_j$ (about 0.25 pF) and negative conductance of $-G$ (about $-50$ mS) when biased; diodes 134 are in pairs separated by a distance of 1 mm along the length of microstrip 138 with l just slightly less than d to account for the diameter of diodes 134 and edge effects of fabrication; and the (unloaded) transmission line defined by microstrip 138 has a capacitance of C per mm (about 2 pF per mm) and an inductance of L per mm (about 5 nH per mm). Then the oscillation frequency f of the diode-loaded transmission line is the frequency at which the diode-loaded transmission line wavelength is twice the physical length d; that is:

$$f = \frac{1}{2d\sqrt{L\left(C + \frac{2C_j}{l}\right)}}.$$

For example, if d=1 mm, then f≈60 GHz. Note that $2C_j/l$ is the capacitance per mm of the diodes 134 along microstrip 138, so the total capacitance per mm is $$C' = C + \frac{2C_j}{l}.$$

Similarly, the total conductance per mm is $$-G' = \frac{-2G}{l}.$$

Also, at this frequency the impedance of the diode-loaded transmission line looking in from transmission line 142 is real; the impedance is that of a transmission line of length d with an open end and is given by:

$$Z_{in} = Z_0 \frac{1 + e^{-2\gamma d}}{1 - e^{-2\gamma d}}$$

where $$\gamma^2 = j\omega L(-G' + j\omega C')$$

and $$Z_0^2 = \frac{j\omega L}{-G' + j\omega C'}.$$

Thus approximating for high frequencies by expanding in terms of $1/\omega$ yields:

$$Z_0 = \sqrt{\frac{L}{C'}} \left(1 + \frac{G'}{2j\omega C'}\right)$$

and $$\gamma = \frac{-G'}{2}\sqrt{\frac{L}{C'}} + j\omega\sqrt{LC'}.$$

The $G'/2j\omega C'$ term is negligible in $Z_0$ for high frequencies and $Z_0$ is essentially real; thus the imaginary part of $Z_{in}$ has a multiplicative factor of $$\sin(2\omega d\sqrt{LC'})$$

and this factor vanishes only if $$\omega = \frac{n\pi}{2d\sqrt{LC'}}$$

for some integral n, which is precisely the oscillation frequency condition for n=2 (recall $\omega=2\pi f$). Thus microstrip transmission line 142 can impedance match oscillator 130 at the oscillation frequency to a load with purely real impedance. Let $G_L$ be the load admittance seen by oscillator 130 then for $G>G_L$ oscillations at frequency $\omega$ grow until nonlinearities limit them and power is delivered to the load. Note that the negative real part of $\gamma$ indicates the oscillation magnitude growth.

Figure 4:
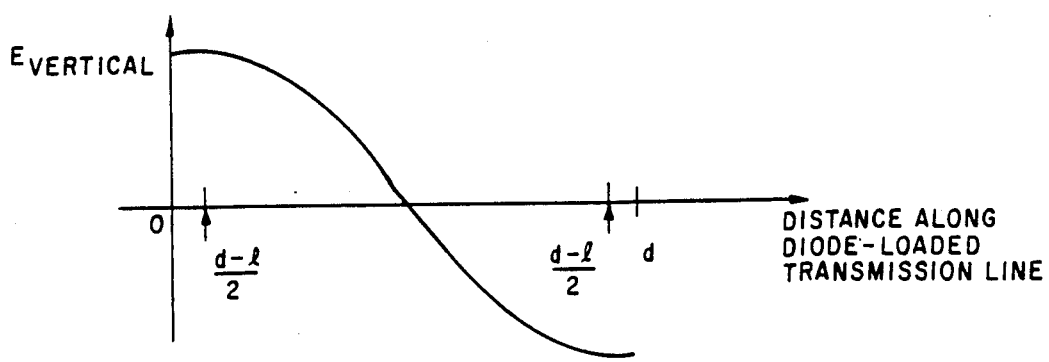
FIG. 4 is an illustration of the location of the diodes of the second preferred embodiment in relation to the standing wave pattern.

Diodes 134 are located approximately at the maximum of the electric field intensity for standing waves at the oscillation frequency; this location maximizes the coupling of diodes 134 to the waves and consequently maximizes the diode efficiency. FIG. 4 illustrates the vertical (orientation as in FIG. 3B) component of the electric field along the diode-loaded transmission line with the location of diodes 134 indicated by the arrows. The pairs of diodes 134 operate 180 degrees out of phase, so each pair of diodes is unaware of the other pair as far as the impedance values are concerned. In other words, the power is generated by two pairs of diodes at the impedance of a single pair. For a given minimum circuit impedance, twice as many diodes can be used in this mode of operation. Oscillator 130 and transmission line 142 may be fabricated by essentially the same method as described in connection with the first preferred embodiment. Note that $2C_j/l$ should be small compared to C in order to avoid effectively shorting the diode-loaded transmission line at the ends; such shorting would imply a minimal electric field at the diodes 134 and consequent minimal efficiency.

Oscillator 130 can be fabricated by the method described in connection with FIGS. 2A-F.

Figure 5A:
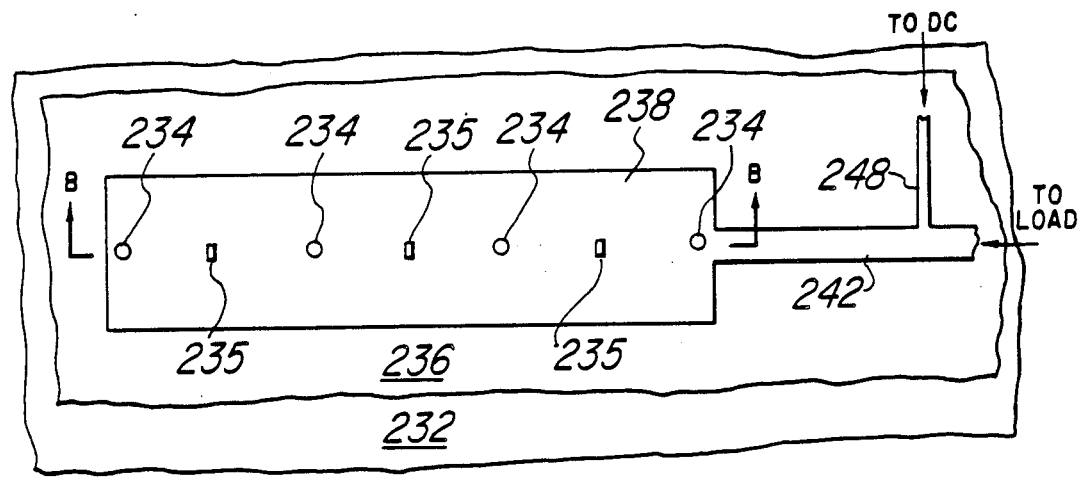
FIGS. 5A–C are plan and cross sectional elevation views of a third preferred embodiment periodic microwave diode stucture.
Figure 5B:
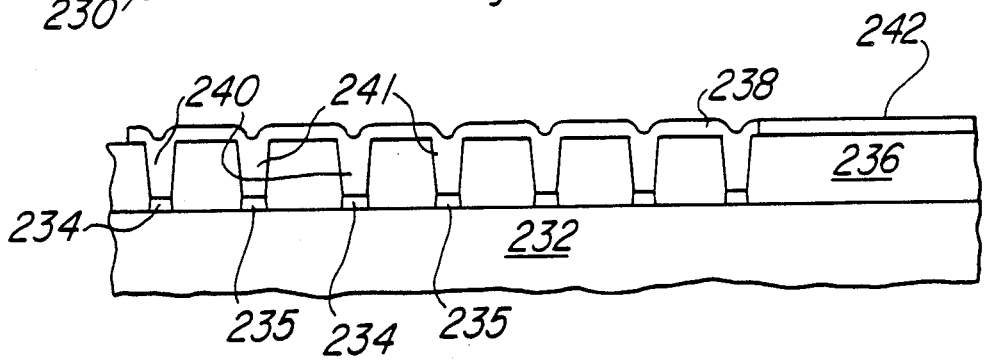
Figure 5C:
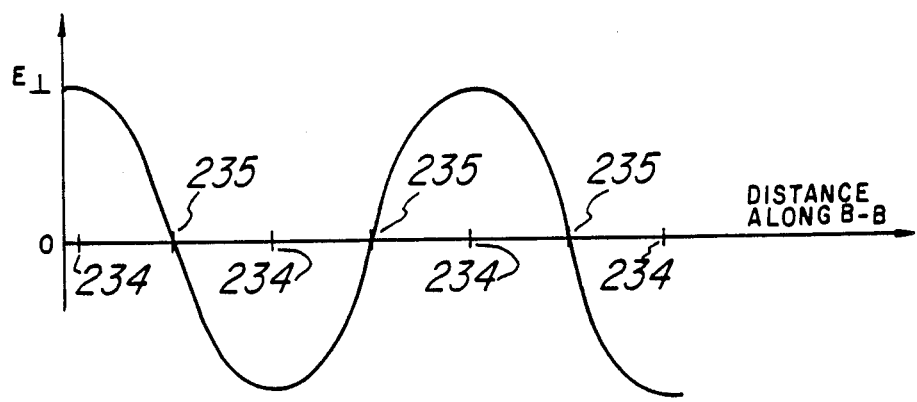

Third preferred embodiment periodic diode structure generally denoted 230 and illustrated in plan and cross sectional views in FIGS. 5A-B is an oscillator connected to microstrip transmission line 242 and includes: four IMPATT diodes 234 on metal heat sink 232 and equispaced under and along microstrip segment 238 and connected to microstrip segment 238 by vias 240, three capacitors 235 on metal heat sink 232 and spaced between diodes 234 and under and along microstrip segment 238 and connected to microstrip segment 238 by vias 241, microstrip transmission line 242, and polyimide dielectric 236. FIG. 5B is the cross sectional elevation view along line B—B of FIG. 5A. The d-c bias for diodes 234 is supplied through high impedance microstrip 248 attached to transmission line 242. Diodes 234 are each 50 μm in diameter and double-drift type with a thickness of about 1 μm. and capacitors 235 are each rectangular 50 μm by 150 μm with insulator made of 0.2 μm thick silicon nitride for a capacitance of about 5-10 pF (about an order of magnitude larger than the microstrip 238 capacitance per mm which, in turn, is larger than the capacitance of a diode 234). Microstrip segment 238 is 750 μm wide and 3 mm long, capacitors 235 are centered at 500, 1,500, and 2,500 μm from the unconnected end of microstrip segment 238, and diodes 234 centered at 50, 1,000, 2,000, and 2,950 μm from the unconnected end (the extreme diodes are 50 μm from segment 238 ends due to the finite diameter of the diodes and fabrication case). Capacitors 235 effectively short microstrip 238, so the longest standing wave has a 1 mm half-wavelength which is the separation of capacitors along microstrip 238. The width of microstrip 238 is substantially less than 1 mm, so the longest wavelength mode is the 1 mm half-wavelength. FIG. 5C illustrates the vertical electric field along the center of microstrip 238 with the locations of diodes 234 and capacitors 235 noted; note that capacitors 235 fix the location of the nodes and consequently diodes 234 are at positions of maximum field and thus maximum coupling and efficiency. The electric field (and magnetic field) decreases exponentially away from the center line of microstrip 238 (line B—B). Note that each of diodes 234 is at maximum electric field location and thus oscillator 230 is more efficient than a comparable oscillator with length only a single half-wavelength (as with oscillator 130) but with four periodic diodes located at each of the two ends and at each of the two points one quarter length in from the ends (the middle point is a node, see FIG. 4, and does not need a diode to still have a periodic diode structure).

Oscillator 230 can be fabricated by the same method as discussed in connection with FIGS. 2A-F but with extra steps around the deposition of titanium 94. Namely just prior to deposition of titanium 94, a 0.2 μm thick layer of silicon nitride is deposited by LPCVD and patterned and etched to form the insulators of capacitors 235; and just after deposition of titanium 94. the titanium is patterned and etched to remove the portion of titanium at and near the perimeters of the silicon nitride insulators.

Figure 6A:
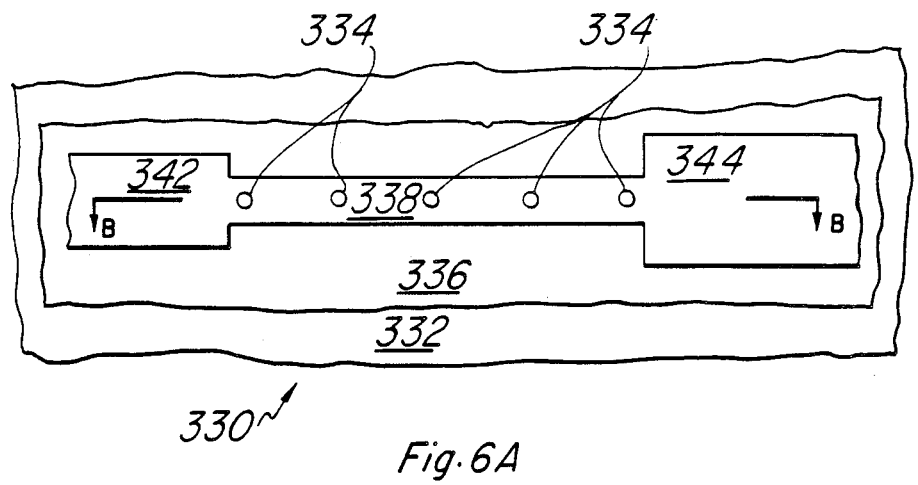
FIGS. 6A–B are plan and cross sectional elevation views of a fourth preferred embodiment periodic microwave diode stucture.
Figure 6B:
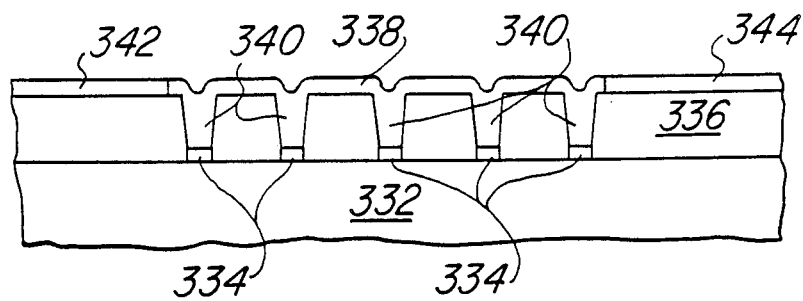

Fourth preferred embodiment periodic diode structure, generally denoted 330 and illustrated in plan and cross secional views in FIGS. 6A-B, is a two-port amplifier connected to microstrip transmission lines and includes: five IMPATT diodes 334 on metal heat sink 332 and equispaced under and along microstrip 338 and connected to microstrip 338 by vias 340, input microstrip transmission line 342, output microstrip transmission line 344, and polyimide dielectric 336. Also, the d-c bias for diodes 334 is supplied through a high impedance attached to transmission line 342 or 344 but not illustrated in the Figures. The dimensions of the elements are as follows: diodes 334 are 50 μm diameter and spaced 200 μm center-to-center, microstrip 338 is 250 μm wide and about 2 mm long, and polyimide 336 is 10 μm thick.

Figure 7:
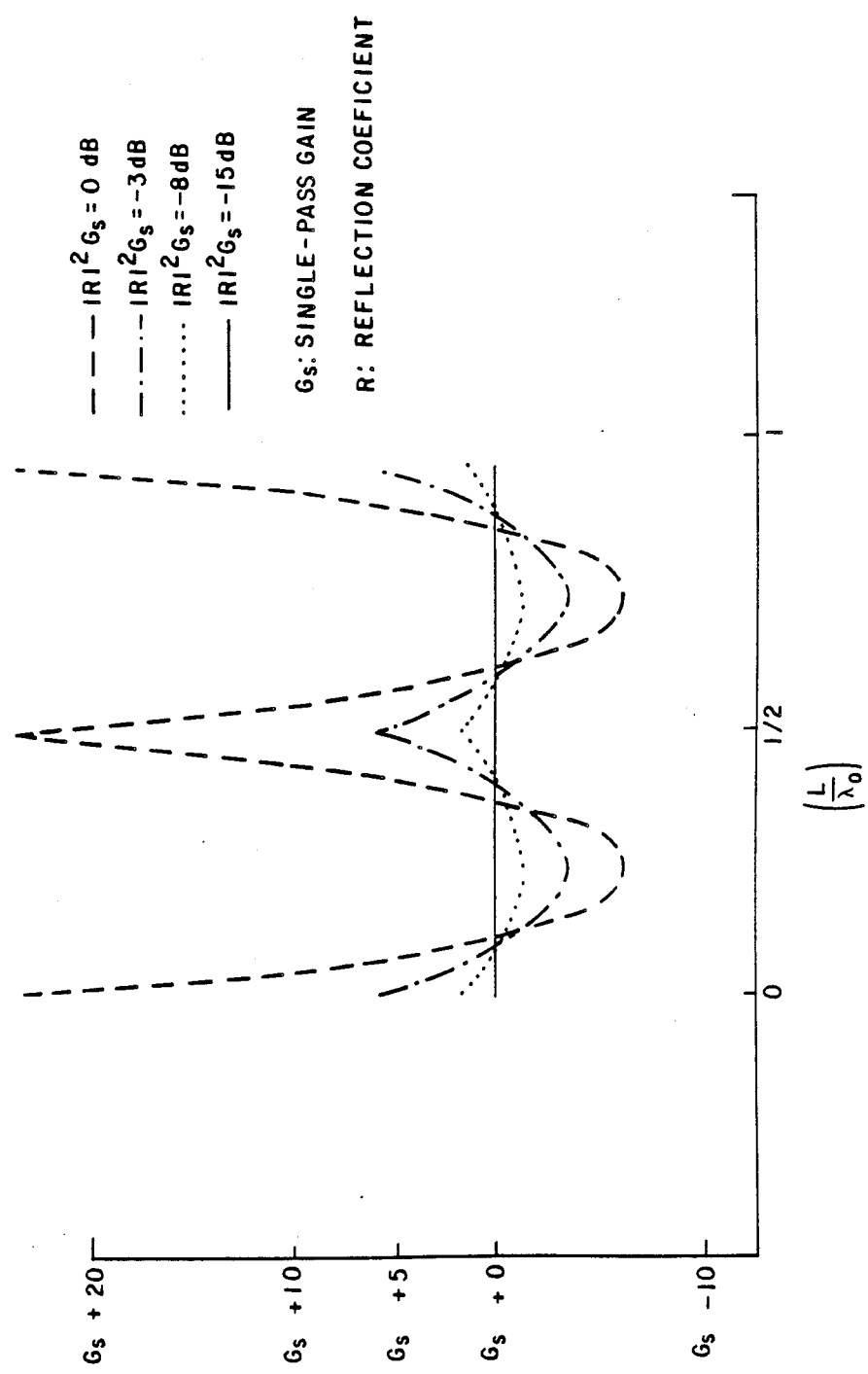
FIG. 7 illustrates the frequency dependence of gain.

The characteristic impedance of the diode-loaded transmission line formed by microstrip 338, dielectric 336, heat sink 332, and diodes 334 and with a small signal model for diodes 334 is given to first order terms in $1/\omega$ by:

$$Z_0 = \sqrt{\frac{L}{C'}} \left(1 + \frac{G'}{2j\omega C'}\right)$$

where $C'$ is the total (distributed plus diode) capacitance per mm, $L$ the inductance per mm, and $G'$ the magnitude of the negative conductance per mm. Thus the characteristic impedance is essentially real and independent of frequency for high frequencies (the $G'/2j\omega C'$ term is negligible for large $\omega$). Further, the attenuation is negative:

$$\alpha = -\frac{G'}{2}\sqrt{\frac{L}{C'}},$$

which implies that signals entering amplifier 330 from transmission line 342 are amplified as they travel down towards transmission line 344. If the input and output impedances seen by amplifier 330 are matched to $Z_0$, then single-pass amplification is obtained; whereas if the impedances are not matched, then reflection at the ends of amplifier 330 occur and multiple-pass amplification is obtained provided that the gain exceeds the reflection. For gain equal to reflection, standing waves occur and amplifier 330 oscillates. FIG. 7 illustrates the frequency dependence of the gain.

Figure 11A:
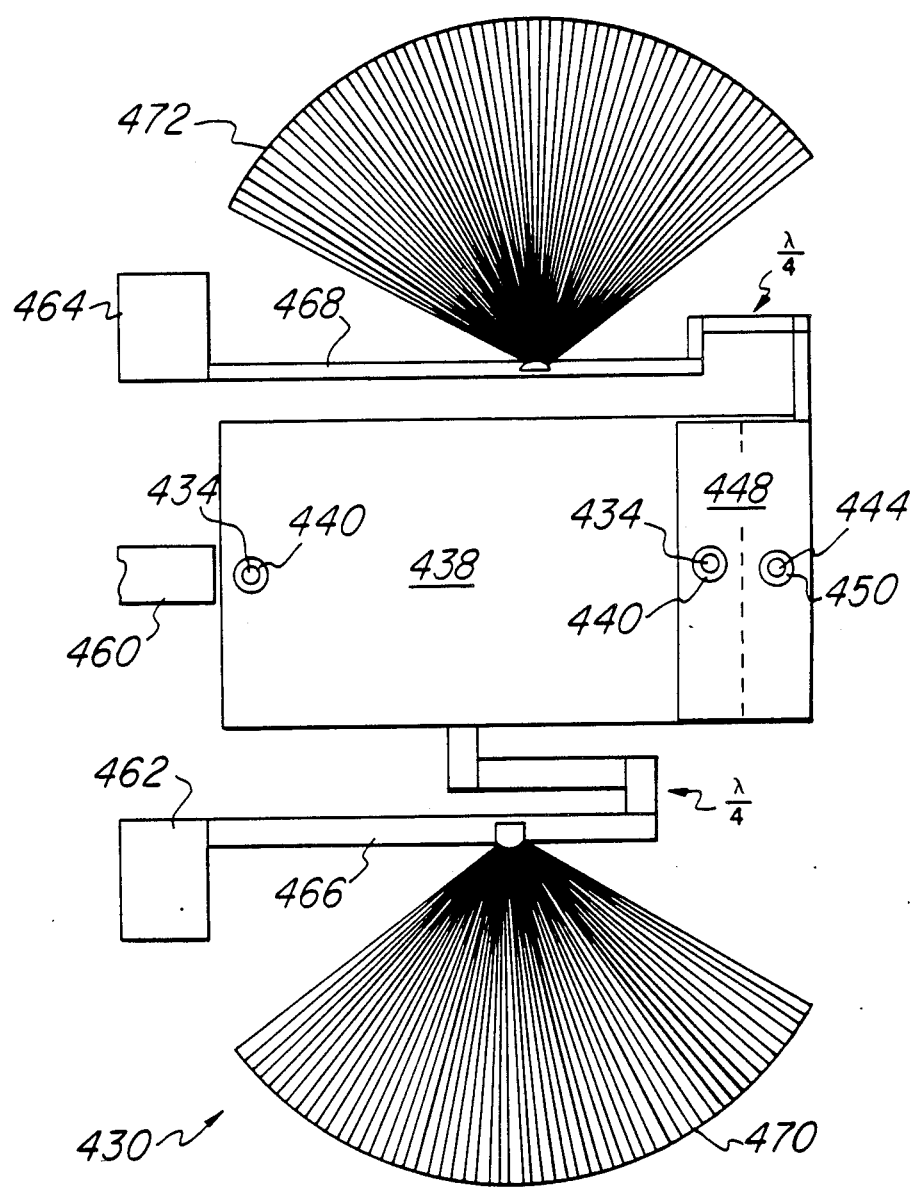
FIGS. 11A–B are plan and cross sectional elevation views of a fifth preferred embodiment periodic microwave structure.
Figure 11B:
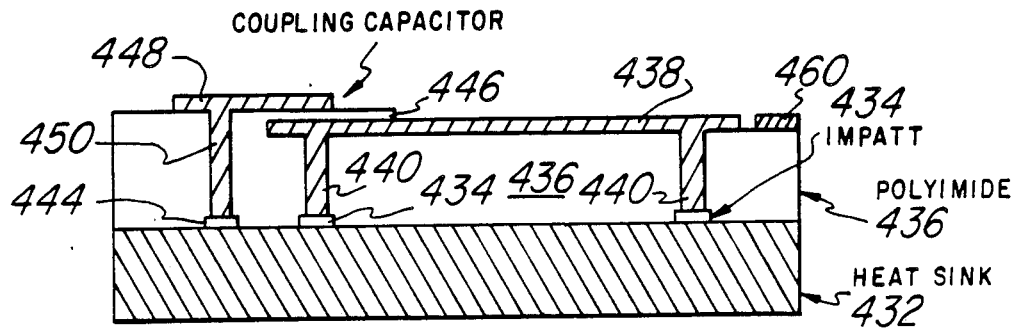

Fifth preferred embodiment periodic diode structure, generally denoted 430 and illustrated in plan and cross sectional elevation views in FIGS. 11A-B, is a voltage controlled oscillator (VCO) and includes heat sink 432, polyimide layer 436 (including portion 446), IMPATT diodes 434, microstrip segment 438 with a via 440 extending down from segment 438 to each diode 434, IMPATT diode 444, coupling capacitor plate 448, via 450 connecting plate 448 to diode 444, output microstrip transmission line 460 capacitively coupled to segment 438, DC bias pads 462 and 464, high impedance microstrip lines 466 and 468 connecting pads 462 and 464 to segment 438 and plate 448, respectively, and radial open stubs 470 and 472 which are located one-quarter wavelength (oscillator center frequency) from segment 438 and plate 448 along lines 466 and 468, respectively. Stubs 470 and 472 provide short circuits for lines 466 and 468 and thus open circuits at the connection of lines 466 and 468 with segment 438 and 448, respectively; this limits loss of microwave power along lines 466 and 468 and through DC power supplies. Also, note that line 466 connects to segment 438 near the length-wise center where the electric field has a node; this further limits microwave power loss through the DC power supply. The dimensions of the elements of VCO 430 are as follows: polyimide 436 is 15 μm thick under segment 438 and polyimide portion 446 is 1 μm thick; microstrip segment 438 is 300 μm wide, 1,000 μm long, and 5 μm thick; coupling capacitor plate 448 is also 300 μm wide and 5 μm thick but only 150 μm long with 75 μm of overlap with segment 438; diodes 434 and 444 are all 35 μm in diameter.

VCO 430 operates in a manner similar to second preferred embodiment oscillator 130 but loaded by a varactor for frequency tuning. IMPATT diodes 434 are periodically located along microstrip segment 438 and biased above breakdown to provide a negative differential conductance; this forms an oscillator with frequency depending upon the length of segment 438 as previously demonstrated in the discussion of the second preferred embodiment oscillator 130. However, the oscillator and IMPATT diode 444 are coupled through a coupling capacitor formed by microstrip segment 438 and plate 448; this loads the oscillator with the reactance of diode 444 and affects the oscillation frequency. Diode 444 is biased below breakdown and therefore draws no current, but the depletion layer capacitance of diode 444 varies with the bias voltage applied through pad 464, and diode 444 functions as a varactor to tune the oscillation frequency. Below breakdown voltage the depletion layer capacitance of diode 444 is proportional to the reciprocal of the square root of the bias voltage.

Figure 12:
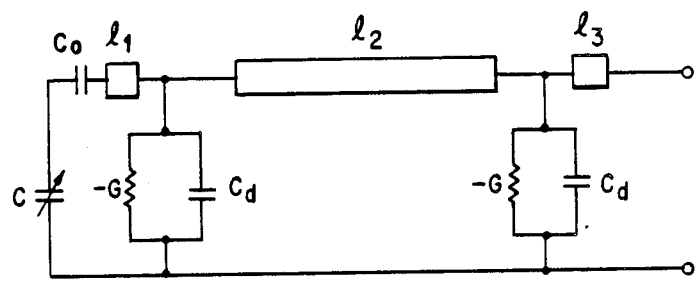
FIG. 12 is an equivalent circuit schematic for the fifth preferred embodiment.

FIG. 12 shows the equivalent circuit of VCO 430. The coupling capacitor value, $C_o$, is determined by the thickness of polyimide layer portion 446 between segment 438 and plate 448 as well as the overlap geometry. Typical values will be between 0.5 to 5 pF. In order to achieve the highest tuning range, the coupling capacitor value, $C_o$, should be maximized. The size of varactor diode 444 should be minimized to obtain the highest output power from VCO 430. Flat-profile IMPATT structures usually yield a varactor capacitance variation of 3:1. With these restrictions, VCOs can be designed to give tuning ranges of about 10 GHz at 60 GHz center with 3 dB variation in power. Less variation in power may be possible by optimizing the location of the IMPATT diodes under segment 438 to take into account of the varactor loading effects. In FIG. 12 varactor diode 444 is denoted as variable capacitor C, diodes 434 are represented as negative conductance $-G$ in parallel with junction capacitor $C_d$, and microstrip segment 438 over heat sink 432 as transmission line portions of lengths $l_1$, $l_2$, and $l_3$ (these lengths would be about 50, 900, and 50 μm. respectively, for VCO 430).

Figure 13:
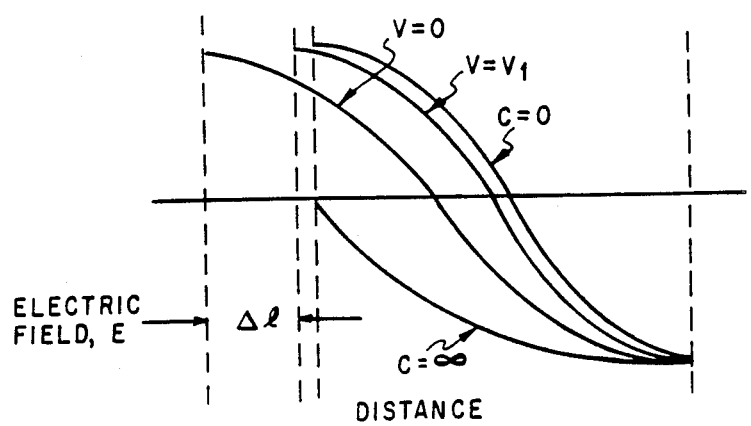
FIG. 13 is illustrates the loading effects of the varactor in the fifth preferred embodiment.

Loading effects of varactor diode 444 on oscillator performance is illustrated in FIG. 13. In the absence of varactor diode 444, the oscillator frequency is maximum since the standing wave electric field pattern is undisturbed (C=0 curve in FIG. 13). In the other extreme, a large area varactor diode 444 will have the effect of shorting the electric field on that end of segment 438. In that case, the standing wave is quarter wave form halving the oscillation frequency of the undisturbed oscillator (C=∞ curve in FIG. 13). The output power also will be half since one of the diodes is now at zero microwave electric field. For more realistic varactor capacitance values the electric field profiles are modified to effectively vary the electrical length of segment 438 as shown in FIG. 13 (curves labelled V=0 and V=V$_1$ showing length Δl). Since the IMPATT diode 434 closest varactor 444 experiences varying microwave voltages, the power contribution from this diode also varies with varactor voltage.

Figure 14A:
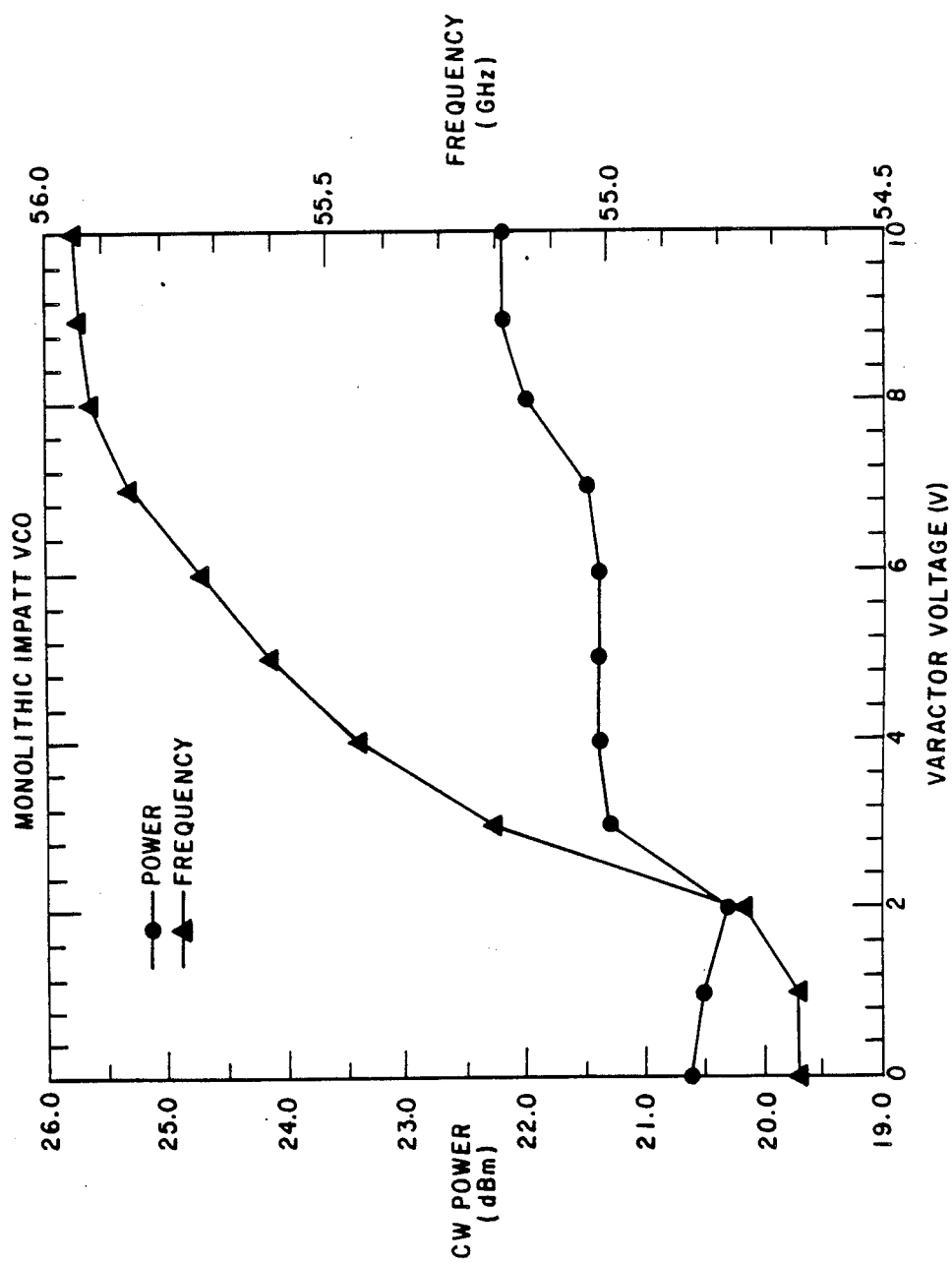
FIGS. 14A–B show experimental results for the fifth preferred embodiment.
Figure 14B:
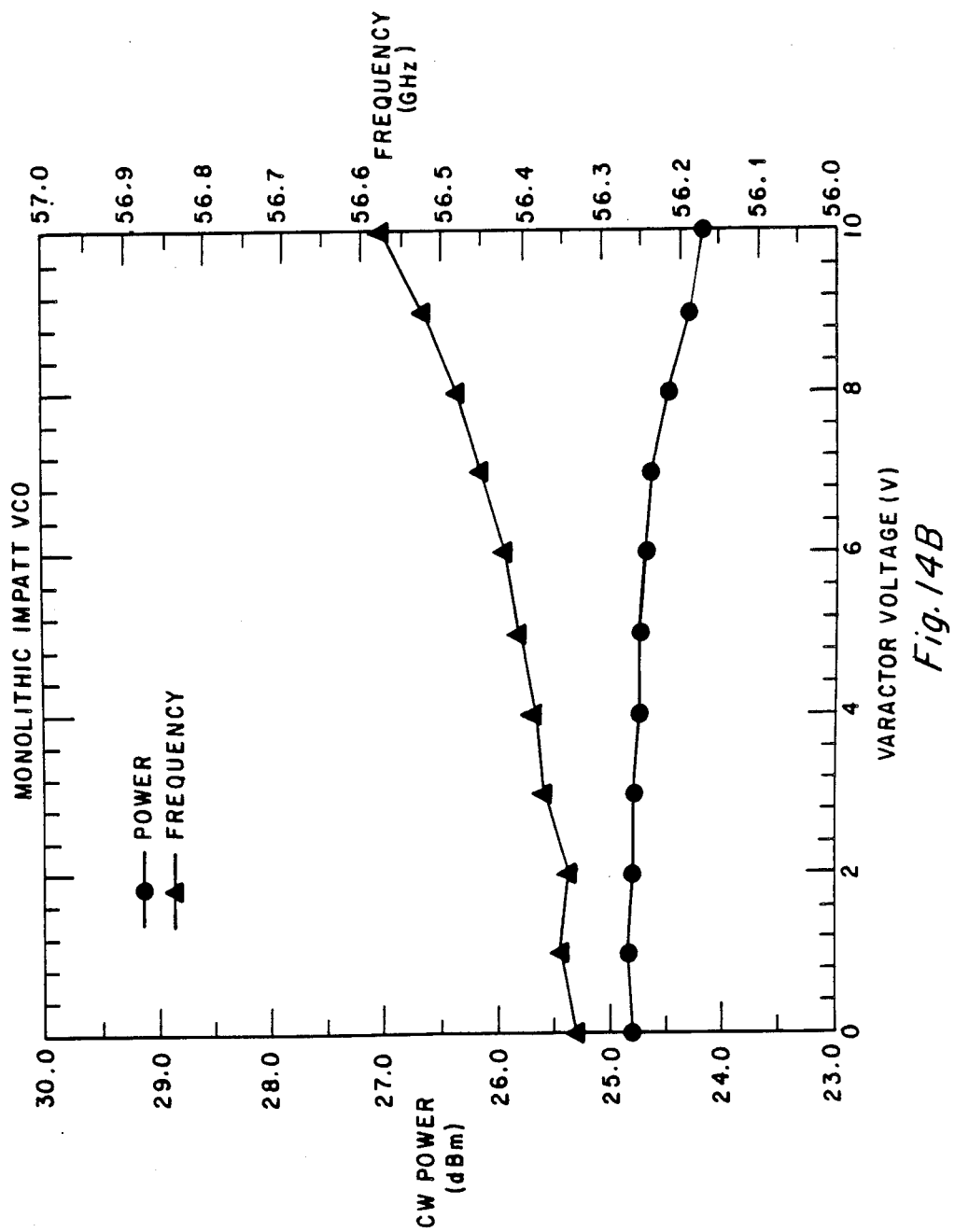

FIGS. 14A–B show the experimental results obtained in V-band. The coupling capacitor values were varied to obtain different tuning ranges. As can be seen in FIG. 14A. more than 1 GHz tuning range is possible. At the expense of narrower tuning range, improved tuning linearity is obtained. The shape and the tuning direction (increased frequency with increasing varactor voltage) are in agreement with theoretical expectations.

Theoretical tuning behavior was investigated using the equivalent circuit of FIG. 12. The IMPATT diode diameter was chosen to be 50 μm for the power devices and the varactor. The doping concentration was assumed to be flat and fixed at $2 \times 10^{17}/cm^3$ for both the n- and p-sides. The diode separation was 0.75 mm to obtain oscillations at 60 GHz with about 2 volts applied to the varactor diode. The tuning behavior was calculated for coupling capacitor values of 4 and 1 pF. The tuning ranges for these capacitors are 5.5 GHz and 2.8 GHz respectively. The power variation for these two case is 1.8 dB and 0.5 dB, respectively. Such large tuning ranges may not be necessary for FMCW applications. Therefore, a coupling capacitor value of less then 1 pF may be more suitable.

MODIFICATIONS AND ADVANTAGES

Various modifications of the preferred embodiment devices may be made while retaining the periodic loading of a transmission line by negative conductance devices. For example, the IMPATT diodes of the preferred embodiments may be replaced with other negative resistance devices such as BARITT, DOVETT, TRAPATT, and other transit-time devices, or such as Gunn diodes and other transferred-electron devices, or such as tunnel diodes or three terminal or other devices biased to a negative resistance region. The polyimide dielectric may be replaced with other dielectrics such as fluorocarbons (Teflon), polystyrene, silicon nitride, silicon dioxide, and so forth. These dielectrics can generally be deposited in thick layers at low temperatures by plasma enhanced deposition; of course, the processing steps illustrated will be adjusted depending on the particular dielectric.

The dimensions, shapes, and materials of the diodes, microstrips, dielectrics, capacitors, etc. may be varied, although the period of the diode locations should be less than one-half of the wavelengths of interest to insure single mode operation. Similarly, if the capacitance of the diodes is larger per length than the unloaded transmission line capacitance and only one or two groups of diodes appear in each period, then the diodes are effectively shorting the transmission line and acting like the capacitors in structure 230 and not coupling to the electric field where the field is large.

Figure 8:
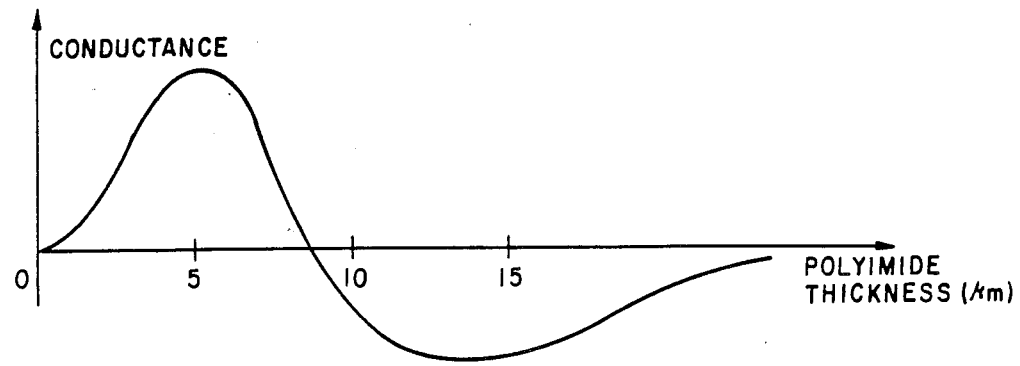
FIG. 8 illustrates the dielectric thickness dependence of gain.

The thickness of the dielectric has a pronounced effect on the operation: very thin dielectric has large metal losses, therefore overall device conductance is positive at the output port resulting in no power generation. If the dielectric is too thick, then the capacitance per unit length of the microstrip is decreased, and the diode size must be decreased to insure diode loading is not too heavy. Small diodes result in small negative condutance and low output power. See FIG. 8 for a graph of the conductance of the diode-loaded transmission line as a function of dielectric thickness.

The dielectric may be a magnetic dielectric and the periodic diode structure may be used for unidirectional amplification and/or for producing circulators integrated with the periodic diode structure. A permanent magnet placed under or over the microstrip will be necessary for magnetic biasing.

Figure 9:
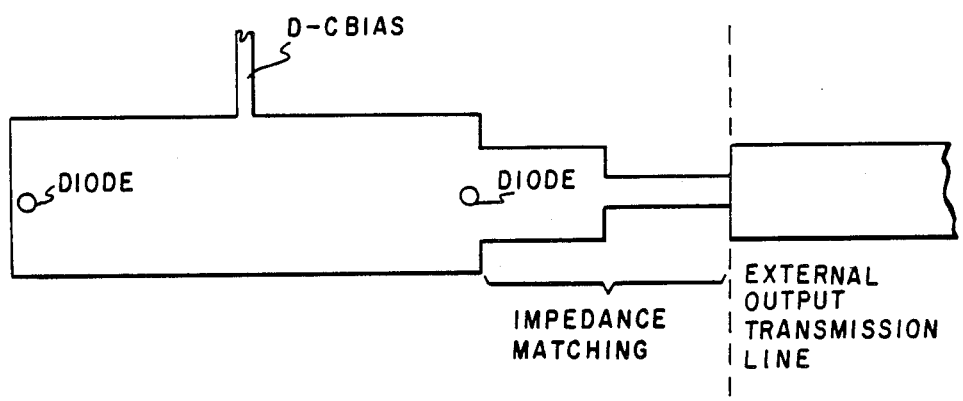
FIG. 9 is a plan view of a periodic microwave diode structure connected as a free-running oscillator.
Figure 10:
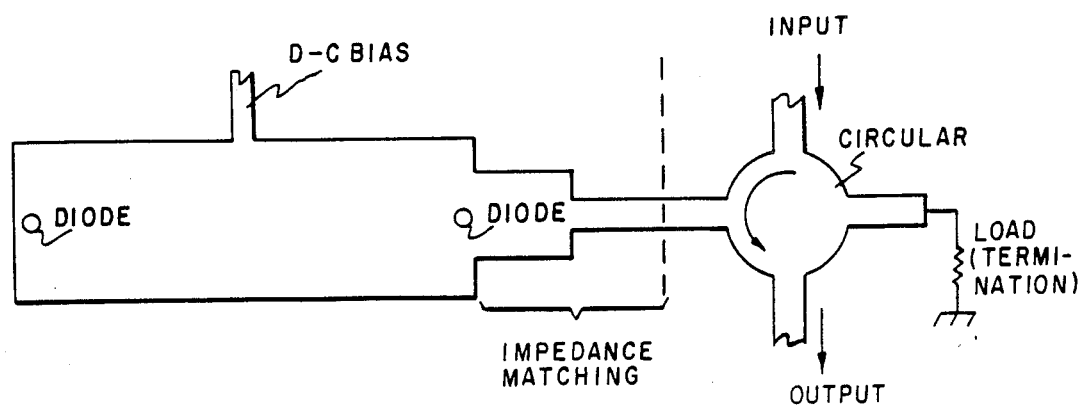
FIG. 10 is a plan view of a periodic microwave diode structure connected as an injection-locked oscillator/reflection amplifier.

Periodic diode structures may be used as parts of various devices, for example, as a free-running oscillator (illustrated in plan view in FIG. 9) and as an injection-locked oscillator/reflection amplifier (illustrated in plan view in FIG. 10). Note that in FIG. 9 the d-c bias line is introduced in the middle of the λ/2 resonator using a high impedance transmission line, and that in both FIG. 9 and FIG. 10 only two groups of diodes with one diode in each group are illustrated for clarity. Since there is an electric field null at the middle, the resonator impedance is very low at the bias line connection and minimal power is transferred to the bias line. The impedance matching is on the same chip as the periodic diode structure and the output transmission line is off chip (broken line chip terminal) in FIG. 9.

The injection-locked oscillator/reflection amplifier of FIG. 10 may have the circulator on chip if a magnetic dielectric is used; otherwise the broken line would show the chip terminal. The impedance matching is adjusted to give the correct impedance level at the chip terminal for the injection-locked oscillator/reflection amplifier.

What is claimed is:

1. A monolithic microwave device, comprising:
   (a) a transmission line segment consisting of a first conductor separated from a second conductor by solid dielectric; and
   (b) a plurality of negative resistance devices in said dielectric located in groups periodically along said segment and connected to said first conductor and formed on said second conductor.

2. The device of claim 1, wherein:
   (a) said first conductor is a microstrip; and
   (b) said second conductor is a heat sink.

3. The device of claim 2, wherein:
   (a) said negative resistance devices are diodes abutting said heat sink.

4. The device of claim 1, further comprising:
   (a) a plurality of capacitors located periodically along said segment between said groups of negative resistance devices and connected from said first conductor to said second conductor.

5. The device of claim 2. further comprising:
   (a) a plurality of capacitors located periodically along said segment between said groups of negative resistance devices and connected from said microstrip to said heat sink.

6. The device of claim 1, wherein:
   (a) there are two of said groups.

7. The device of claim 1, wherein:
   (a) each of said groups of negative resistance devices is a single negative resistance device.

8. The device of claim 1, wherein:
   (a) each of said groups of negative resistance devices is a pair of negative resistance devices.

9. The device of claim 1, wherein:

(a) said negative resistance devices have a capacitance per unit length along said transmission line segment that is less than the capacitance per unit length of said transmission line.

10. The device of claim 1, wherein:
(a) said dielectric is polyimide.

11. The device of claim 2, wherein:
(a) said dielectric is polyimide and of thickness greater than the thickness at which the transmission line conductor losses equal the magnitude of the device negative resistances.

12. The device of claim 2, wherein:
(a) said dielectric is polyimide and of thickness in the range of 10 to 20 μm.

13. A monolithic microwave oscillator, comprising:
(a) a transmission line segment consisting of a first conductor separated from a second conductor by solid dielectric;
(b) a first group of negative resistance devices in said dielectric located near a first end of said segment;
(c) a second group of negative resistance devices in said dielectric located near the end of said segment remote from said first end;
(d) and each of said negative resistance devices connected to said first conductor and formed on said second conductor; and
(e) an output connected to said first end.

14. The oscillator of claim 13, further comprising:
(a) a varactor coupled to said segment at said remote end.

15. The oscillator of claim 14, wherein:
(a) said varactor is an IMPATT diode biased below breakdown;
(b) said varactor is coupled to said segment by a capacitor; and
(c) said output is capacitively coupled to said first end.

16. The oscillator of claim 13, further comprising:
(a) at least one further group of negative resistance devices located along said segment making all of said groups approximately equispaced along said segment;
(b) said further negative resistance devices also connected from said first conductor to said second conductor.

17. The oscillator of claim 16, further comprising:
(a) a plurality of capacitors connected from said first conductor to said second conductor;
(b) said capacitors located along said segment approximately at the midpoints between adjacent ones of said groups of negative resistance devices.

18. The oscillator of claim 13, further comprising:
(a) a d-c bias line for said negative resistance devices and connected to approximately the midpoint of said first conductor.

19. The oscillator of claim 13, wherein:
(a) said first conductor is a microstrip;
(b) said second conductor is a heat sink; and
(c) said negative resistance devices are diodes.

20. A monolithic microwave device, comprising:
(a) a transmission line segment consisting of a first conductor separated from a second conductor by solid dielectric;
(b) a first group of negative resistance devices in said dielectric located near a first end of said segment;
(c) a second group of negative resistance devices in said dielectric located near the end of said segment remote from said first end;
(d) each of said negative resistance devices connected to said first conductor and formed on said second conductor;
(e) a circulator with a first port connected to said first end;
(f) an input connected to a second port of said circulator; and
(g) an output connected to a third port of said circulator.

21. The device of claim 20, wherein:
(a) said first conductor is a microstrip;
(b) said second conductor is a heat sink; and
(c) said negative resistance devices are diodes abutting said heat sink.

22. A monolithic microwave two-port amplifier, comprising:
(a) a transmission line segment consisting of a first conductor separated from a second conductor by solid dielectric;
(b) a plurality of negative resistance devices in said dielectric located in groups periodically along said segment and connected to said first conductor and formed on said second conductor;
(c) an input connected to a first end of said segment; and
(d) an output connected to the end of said segment remote from said first end.

23. The device of claim 22, wherein:
(a) said first conductor is a microstrip;
(b) said second conductor is a heat sink;
(c) said negative resistance devices are diodes abutting said heat sink; and
(d) each of said groups is a single diode.

* * * * *